United States Patent [19]
Okubo et al.

[11] Patent Number: 5,416,426
[45] Date of Patent: May 16, 1995

[54] METHOD OF MEASURING A VOLTAGE WITH AN ELECTRON BEAM APPARATUS

[75] Inventors: Kazuo Okubo; Akio Ito; Takayuki Anbe; Hironori Teguri, all of Kawasaki, Japan

[73] Assignee: Fujitsu Limited, Kawasaki, Japan

[21] Appl. No.: 176,116

[22] Filed: Dec. 30, 1993

Related U.S. Application Data

[62] Division of Ser. No. 854,531, Mar. 19, 1992, Pat. No. 5,300,880.

[30] Foreign Application Priority Data

Mar. 19, 1991 [JP] Japan ................... 3-055036

[51] Int. Cl.⁶ .......................................... G01R 31/00
[52] U.S. Cl. ........................................... 324/751
[58] Field of Search ............ 324/158 R, 158 D, 73.1, 324/71.3, 750, 751; 250/310, 311, 492.1, 492.2; 356/400, 401

[56] References Cited

U.S. PATENT DOCUMENTS

| 4,755,749 | 7/1988 | Ookubo et al. | 324/158 D |
| 5,093,616 | 3/1992 | Seitoh et al. | 324/158 D |

FOREIGN PATENT DOCUMENTS

| 156006 | 10/1985 | European Pat. Off. |
| 213871 | 3/1987 | European Pat. Off. |
| 2021789 | 12/1979 | United Kingdom |

OTHER PUBLICATIONS

Ito et al., "A Logic State Measurement Technique Using Multi-Stroboscopic Sampling for the Electron Beam Tester", *Fujitsu Scientific & Technical Journal*, vol. 26, No. 1 (Apr. 1990), pp. 65–70, Kawasaki, JP.

Harbeck et al., "Timing diagram: a new electron-beam test technique for linking IC-internal measurements to simulation", *Microelectronic Engineering*, vol. 13, No. 1/4 (May 1990), pp. 121–128, Amsterdam, NL.

Reiners, "Fundamentals of Electron Beam Testing via Capacitive Coupling Voltage Contrast", *Microelectronic Engineering*, vol. 12, No. 1/4, pp. 325–340, May 1990, Amsterdam, NL.

Brust et al., "Logic-State Tracing: Electron Beam Testing by Correlation", *Microelectronic Engineering*, vol. 3, No. 1/4, pp. 191–202, Dec. 1985, Amsterdam, NL.

*Patent Abstracts of Japan*, vol. 6, No. 203 (P-148) (1081), Oct. 14, 1982 (JP 57-111457).

Miyoshi et al., "Electronic beam tester which is beginning to help for developing VLSI," *Nikkei Electronics*, Nov. 8, 1992, pp. 171–185 (with partial English language translation by Mr. Motohashi).

*Primary Examiner*—Vinh Nguyen
*Attorney, Agent, or Firm*—Staas & Halsey

[57] ABSTRACT

A method of measuring a voltage with an electron beam apparatus considers a change in a convergence factor due to a change in an S curve, as well as an error in a secondary electron signal level with a phase of measurement being scanned at random, to accurately measure the voltage. The method measures the voltage of a voltage measuring spot on a sample, prepares an analytic voltage by superimposing a probe voltage having an average of 0 V and no correlation with the measured voltage on the measured voltage, measures a secondary electron signal level with the analytic voltage, computes a convergence factor around a slice level set on the S curve according to a correlation between the secondary electron signal level and the probe voltage and according to an autocorrelation of the probe voltage, and updates the analytic voltage according to the convergence factor, thereby updating the measured voltage.

1 Claim, 16 Drawing Sheets

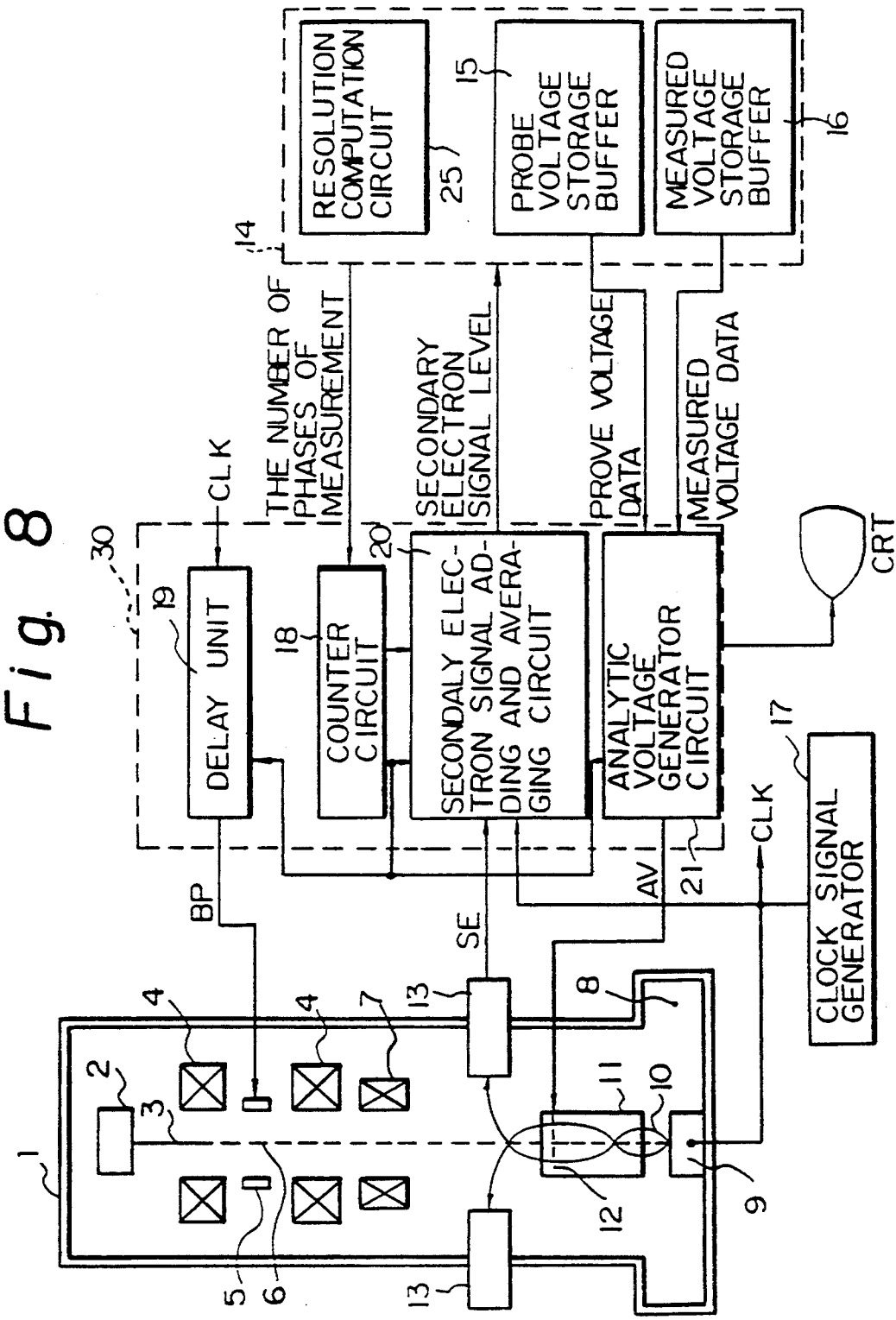

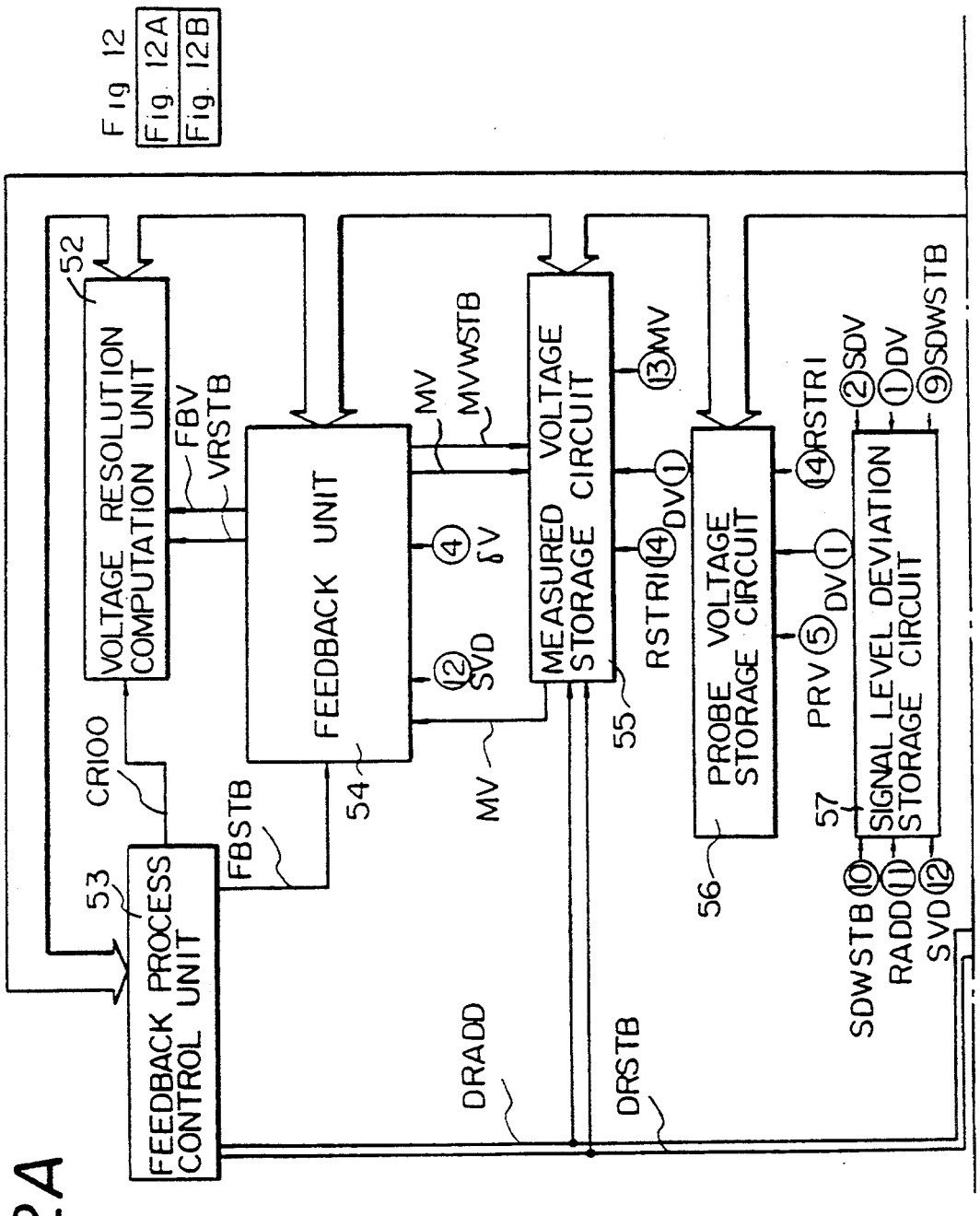

METHOD OF MEASURING A VOLTAGE WITH AN ELECTRON BEAM APPARATUS

This application is a division of application Ser. No. 07/854,531, filed Mar. 19, 1992, now U.S. Pat. No. 5,300,880.

BACKGROUND OF THE INVENTION

1. Field of the Invention

The present invention relates to a method of measuring a voltage on, for example, an integrated circuit with an electron beam apparatus, to thereby diagnose the integrated circuit.

2. Description of the Related Art

FIG. 1 shows essential part of a conventional electron beam apparatus.

In the figure, numeral 1 denotes a lens barrel, 2 an electron gun, 3 an electron beam emitted from the electron gun 2, 4 an electron lens, 5 a blanker for shaping the electron beam 3 into a pulse strobe beam 6, 7 a deflector coil for deflecting the strobe beam 6, 8 a sample chamber, 9 a sample LSI to be measured, 10 secondary electrons produced by the sample LSI 9, 11 an energy analyzer having an analyzer grid 12 for producing a decelerating electric field for controlling a passage of the secondary electrons 10, and 13 a secondary electron detector. In this electron beam apparatus, the voltage of a signal to be measured on the sample LSI 9 is given as an analytic voltage that provides a secondary electron signal level that is equal to a slice level set on an analytic-voltage-to-secondary-electron-signal-level-characteristic curve, i.e., a so-called S curve. To find the voltage, a closed loop method is employed.

The closed loop method will be explained with reference to FIGS. 2 and 3.

In FIG. 2, a slice level SL is set on an S curve. Around the slice level SL, the S curve has an inclination of $\beta(=\delta S/\delta V)$. An inverse number of the inclination $\beta$ is a convergence factor $\alpha(=-\delta V/\delta S)$.

In FIG. 3, an initial analytic voltage VR0 is applied to the analyzer grid 12, and a secondary electron signal is sampled. The level of the sampled secondary electron signal is S0, and the analytic voltage is updated by $\alpha(S0-SL)$. The updated voltage of $VR1=VR0+\alpha(S0-SL)$ is applied to the analyzer grid 12, and a secondary electron signal is sampled. The level of the sampled secondary electron signal is S1, and the analytic voltage is updated by $\alpha(S1-SL)$. The updated voltage of $VR2=VR1+\alpha(S1-SL)$ is applied to the analyzer grid 12.

In this way, the analytic voltage is successively updated. When the absolute value of an analytic voltage updating quantity becomes smaller than a given value, an analytic voltage that may provide the slice level SL is measured several times, and the measured voltages are added and averaged to provide a measured voltage of an objective signal.

As shown in FIG. 4, the S curve of the electron beam apparatus changes due to contamination during measurement and beam current fluctuations caused by changes in a beam axis, thereby changing the convergence factor $\alpha$. In spite of this fact, the conventional technique computes the convergence factor $\alpha$ of the electron beam apparatus only once at the start of measurement and never updates it during the measurement, thereby deteriorating the accuracy of measurement.

In addition, the conventional technique often scans a phase of measurement synchronously with, for example, a counter circuit. This may cause an error in a detected secondary electron signal level because of the influence of an insulation film disposed over wiring of an IC whose voltage is to be measured. To avoid this, the conventional technique employs a method of scanning a phase of measurement at random.

FIG. 5 shows an example of a signal to be measured. Scanning a phase of measurement at random may provide analytic voltages, i.e., measured voltages as shown in FIG. 6.

According to this method, the number of sampling strobes at each phase may be 100 to 500. With a sampling rate of 10 MHz, a sampling time at each phase will be about 10 to 50 $\mu$s.

The analytic voltage, however, must not be changed too rapidly because this may increase loads on the analyzer grid 12 and peripheral circuits. After the analytic voltage is changed, a settling time of about 20 $\mu$s is needed. This settling time is nearly equal to the sampling time. Accordingly, a secondary electron signal is sampled not with a specified analytic voltage but with an equivalent analytic voltage Veff expressed as follows:

$$Veff = V1 + \frac{(V0 - V1)}{\tau_s} \int_0^{\tau_s} e^{-\frac{t}{\tau_v}} dt = V1 + (V0 - V1) \cdot \frac{\tau_v}{\tau_s} \cdot (1 - e^{-\frac{\tau_s}{\tau_v}}) \quad (1)$$

where V0 is an analytic voltage of the last measurement, V1 is an analytic voltage of this time, $\tau s$ is a time necessary for sampling a secondary electron signal at a given phase, and $\tau v$ is a settling time of the analytic voltage (FIG. 7). Accordingly, the analytic voltage of this time involves an error proportional to an analytic voltage change (V0−V1). Around a slice level, the analytic voltage is proportional to a secondary electron signal level. Accordingly, the error proportional to the change (V0−V1) is superimposed on the secondary electron signal. This error is observed as noise on a measured voltage. To avoid the noise, the conventional technique puts a settling time of about 10 to 20 $\mu$s after the analytic voltage is changed, and after the settling time, starts sampling a secondary electron signal. This raises a problem of elongating measuring time.

SUMMARY OF THE INVENTION

To solve the problems, an object of the invention is to provide a method of measuring a voltage with an electron beam apparatus that includes an electron beam pulse generator means for generating an electron pulse beam for irradiating a voltage measuring spot on a sample, an energy analyzer having an analyzer grid to which an analytic voltage is applied to produce a decelerating electric field for controlling a passage of secondary electrons produced from the voltage measuring spot on the sample, and a secondary electron detector for detecting the secondary electrons passed through the energy analyzer. This method considers a convergence factor's change caused by a change in an S curve, as well as an error in a secondary electron signal level caused by scanning a phase of measurement at random, to precisely measure the voltage.

By using the electron beam apparatus, a first invention measures a voltage of the voltage measuring spot on the sample, prepares an analytic voltage by superimposing an alternating voltage (hereinafter referred to as the probe voltage) having an average of 0 V and no correlation with the measured voltage, on the measured voltage, measures a secondary electron signal level with the analytic voltage, computes a convergence factor around a slice level set on an S curve, according to a correlation between the secondary electron signal level and the probe voltage and according to an autocorrelation of the probe voltage, and updates the analytic voltage according to the convergence factor, thereby updating the measured voltage.

By using the electron beam apparatus, a second invention measures a secondary electron signal level by applying an analytic voltage to the analyzer grid with a phase of measurement being shifted at random, measures a change in the analytic voltage at each phase of measurement, computes an error in the measured secondary electron signal level according to a correlation between the change in the analytic voltage and the secondary electron signal level and according to an autocorrelation of the change in the analytic voltage, obtains a correct secondary electron signal level according to the error, and obtains an updated measured voltage according to the correct secondary electron signal level, a slice level set on an analytic-voltage-to-secondary-electron-signal-level-characteristic curve, the analytic voltage, and a convergence factor around the slice level.

As mentioned above, the first invention considers a convergence factor's change caused by a change in the S curve in calculating a new convergence factor, and according to which, provides an updated analytic voltage to correctly provide a measured voltage.

Similarly, the second invention considers an error in a secondary electron signal level when scanning a phase of measurement at random and computes a correct secondary electron signal level to accurately provide a measured voltage.

BRIEF DESCRIPTION OF THE DRAWINGS

FIG. 8 is a view showing essential part of an electron beam apparatus according to a first embodiment based on the first invention;

DESCRIPTION OF THE PREFERRED EMBODIMENTS

Figure 1:
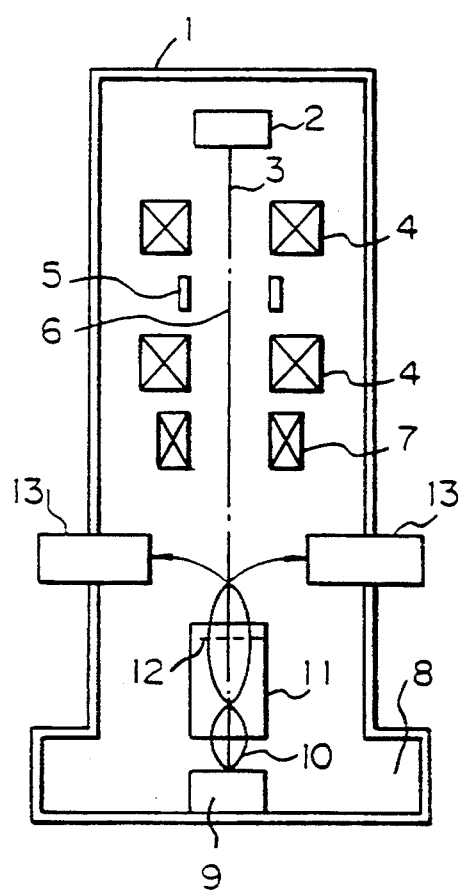
FIG. 1 is a view showing an essential part of a conventional electron beam apparatus.
Figure 2:
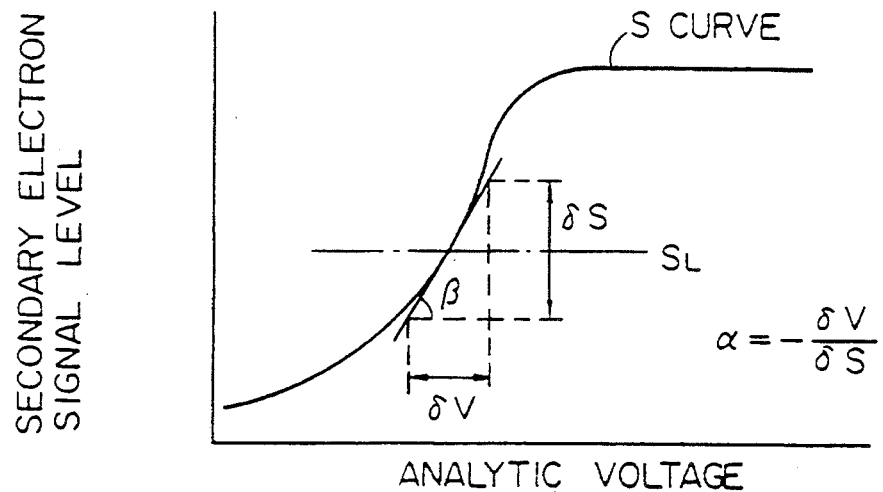
FIGS. 2 and 3 are views explaining a closed loop method.
Figure 3:
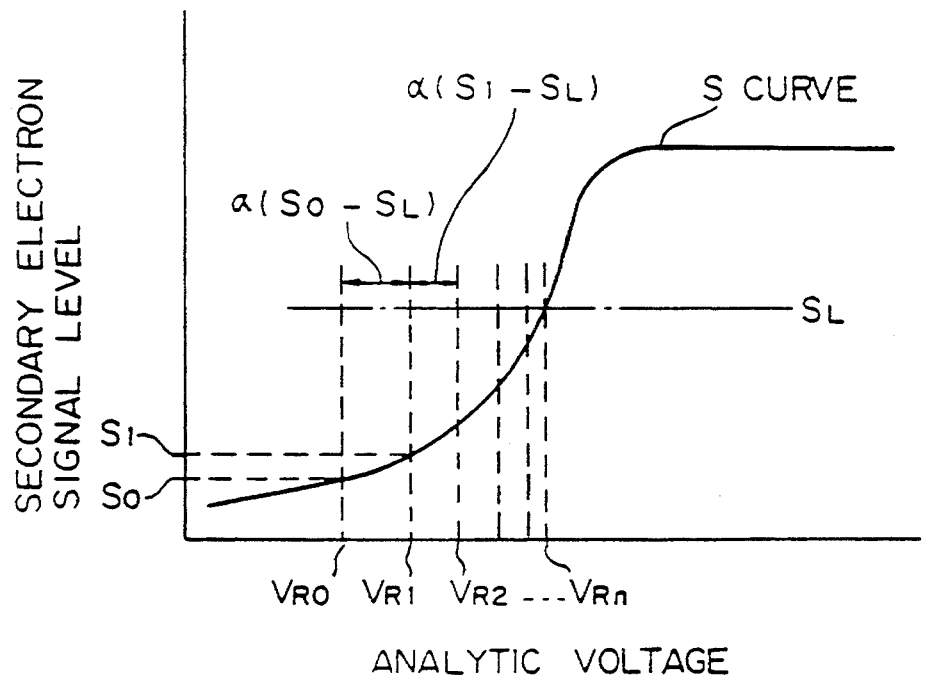
Figure 4:
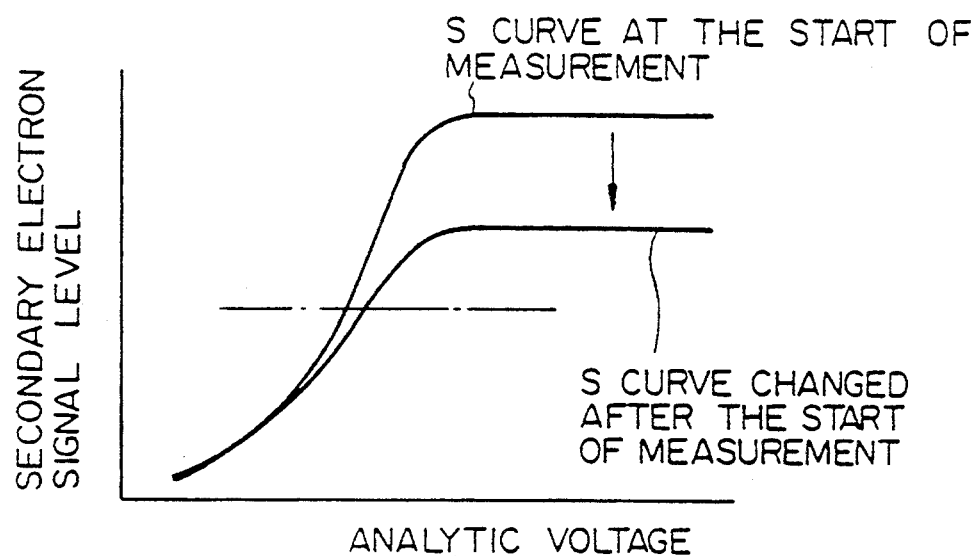
FIG. 4 is a view showing a change in an S curve.
Figure 5:
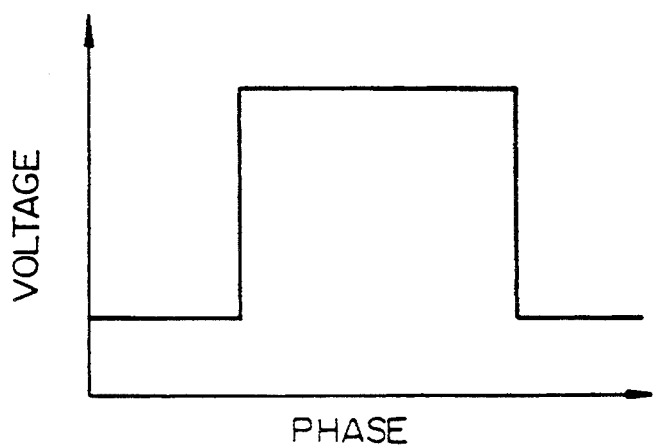
FIG. 5 is a view showing a true voltage waveform.
Figure 6:
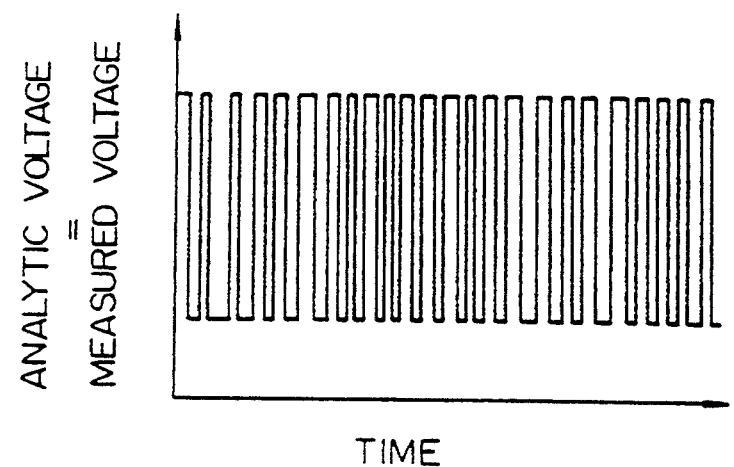
FIG. 6 is a view showing a waveform of analytic voltages with a phase of measurement being shifted at random.
Figure 7:
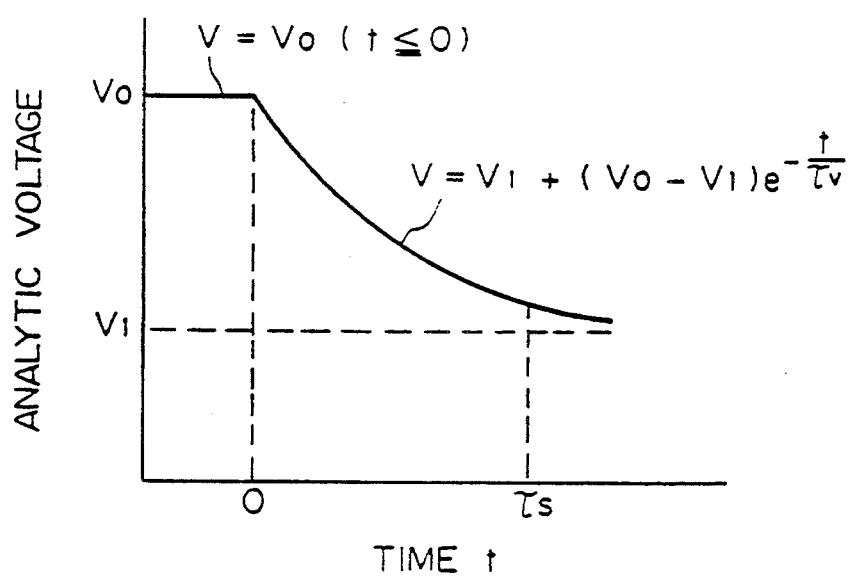
FIG. 7 is a view explaining a problem caused by the random scanning of the measurement phase.

The first and second embodiments of the invention will be explained with reference to FIGS. 8 to 10. In the figures, the same parts as those shown in FIG. 1 are represented with like reference marks and not repeatedly explained.

FIG. 8 shows essential part of an electron beam apparatus according to the first embodiment based on the first invention.

In the figure, numeral 14 is a control computer, 15 a probe voltage storage buffer for storing a probe voltage, 16 a measured voltage storage buffer for storing a measured voltage, 17 a clock signal generator for generating a clock signal, 18 a counter circuit for providing data for specifying a phase of measurement according to the number of phases of measurement provided by the control computer 14, 19 a delay unit for providing a blanking pulse to a blanker 5 according to a phase of measurement provided by the counter circuit 18, 20 a secondary electron signal adding and averaging circuit for adding up and averaging secondary electron signals provided by a secondary electron detector 13, 21 an analytic voltage generator for receiving probe voltage data from the probe voltage storage buffer 15 as well as measured voltage data from the measured voltage storage buffer 16, and generating an analytic voltage as a sum of the measured voltage and probe voltage corresponding to the phase of measurement specified by the counter circuit 18. The circuits 18, 19, 20, and 21 form a signal processing circuit 30. The control computer 14 includes a resolution computation circuit 25.

FIGS. 9(a) through 9(g) explain procedures of voltage measurement according to the first embodiment.

Figure 9A:
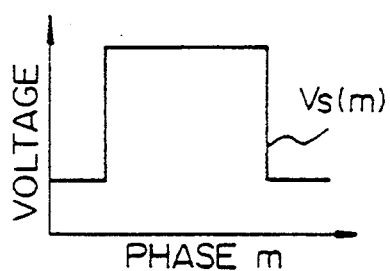
FIGS. 9(a) through 9(g) are views explaining a voltage measuring method according to the first embodiment.

FIG. 9(a) shows the waveform of a true voltage Vs(m) at a measuring spot, where m is a variable representing a phase of measurement.

Figure 9E:
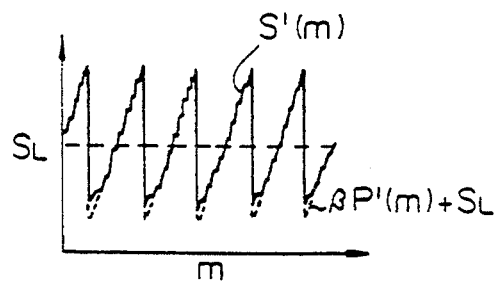
Figure 9B:
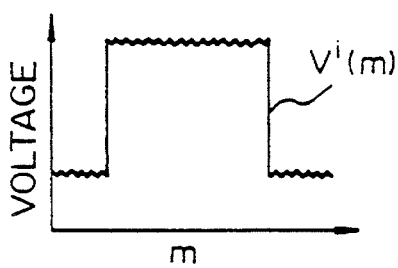

It is supposed that an "i"th measurement provides a measured voltage of $V^i(m)$, which is stored in the measured voltage storage buffer 16 of the control computer 14. The measured voltage $V^i(m)$ and true voltage Vs(m) are expressed as follows:

$$V^i(m) = Vs(m) + N^i(m) \qquad (2)$$

where $N^i(m)$ is noise whose size is unknown (FIG. 9(b)).

Figure 9F:
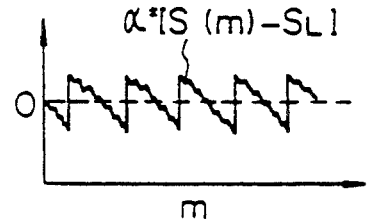
Figure 9C:
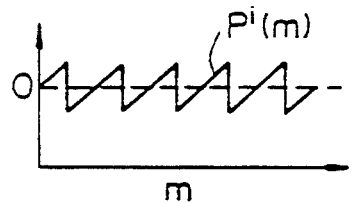

According to the first embodiment, a probe voltage $P^i(m)$ shown in FIG. 9(c) having an average of 0 V and a standard deviation of 0.2 to 0.3 V is stored in the probe voltage storage buffer 15. The probe voltage $P^i(m)$ of FIG. 9(c) is only an example and preferably a random noise.

An "i+1"th voltage measurement is carried out by applying an analytic voltage of $VR^i(m)$ to the analyzer grid 12. The analytic voltage $VR^i(m)$ is equal to a voltage of $V^i(m)+P^i(m)$, i.e., a sum of the "i"th measured voltage $V^i(m)$ stored in the measured voltage storage buffer 16 and the probe voltage $P^i(m)$ stored in the probe voltage storage buffer 15, as shown in FIG. 9(d). In this figure, a dotted line represents the true voltage $Vs(m)$. The above addition is carried out according to a phase of measurement specified by the counter circuit 18. The contents of the counter circuit 18 are transferred to the delay unit 19, which sets the phase of measurement accordingly.

The secondary electron signal adding and averaging circuit 20 samples, according to phases of measurement specified by the counter circuit 18, secondary electron signals provided by the secondary electron detector 13, adds and averages the levels of the sampled secondary electron signals, and provides an averaged value and a sampling end signal to the control computer 14. A secondary electron signal level $S^i(m)$ shown in FIG. 9(e) is expressed as follows:

$$S^i(m) = \beta[N^i(m) + P^i(m)] + SL + n^i(m) \quad (3)$$

where, $\beta$ is an inclination of an S curve around a slice level SL, and $n^i(m)$ is noise. A dotted line shown in FIG. 9(e) is expressed as $\beta P^i(m) + SL$.

The control computer 14 computes a correlation between the secondary electron signal level $S^i(m)$ and the probe voltage $P^i(m)$ as follows:

$$\sum_m S^i(m) \cdot P^i(m) = \beta \sum_m N^i(m) \cdot P^i(m) + \quad (4)$$
$$\beta \sum_m [P^i(m)]^2 + SL \sum_m P^i(m) +$$
$$\sum_m n^i(m) \cdot P^i(m) = \beta^* \sum_m [P^i(m)]^2$$

where $\beta^*$ is expressed as follows:

$$\beta^* = \quad (5)$$
$$\beta + \beta \frac{\sum_m N^i(m) \cdot P^i(m)}{\sum_m [P^i(m)]^2} + \frac{SL \sum_m P^i(m) + \sum_m n^i(m) \cdot P^i(m)}{\sum_m [P^i(m)]^2}$$

Accordingly, an approximate value $\alpha^*$ of the convergence factor $\alpha$ is expressed as follows:

$$\alpha^* = -\frac{1}{\beta^*} = -\frac{\sum_m [P^i(m)]^2}{\sum_m S^i(m) \cdot P^i(m)} \quad (6)$$

Figure 9G:
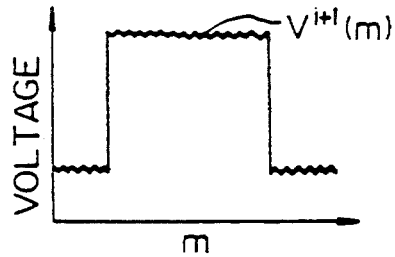
Figure 9D:
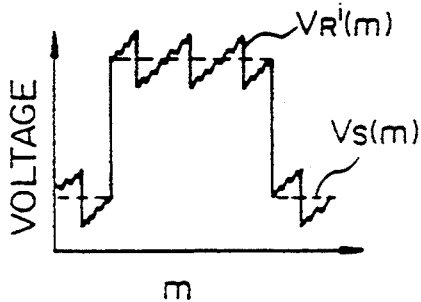

According to this embodiment, $\alpha^*[S^i(m)-SL]$ is fed back as a feedback voltage as shown in FIG. 9(f), and a new measured voltage $V^{i+1}(m)$ shown in FIG. 9(g) is obtained as follows:

$$\begin{aligned} V^{i+1}(m) &= VR^i(m) + \alpha^*[S^i(m) - SL] \\ &= Vs(m) + \\ &\quad \left(1 - \frac{\alpha^*}{\alpha}\right)[N^i(m) + P^i(m)] + \\ &\quad \alpha^* n^i(m) \end{aligned} \quad (7)$$

Here, $\alpha^*$ accurately agrees with $\alpha$, so that the second term will be ignored as follows:

$$V^{i+1}(m) = Vs(m) + \alpha^* n^i(m) \quad (8)$$

The new measured voltage $V^{i+1}(m)$ is stored in the measured voltage storage buffer 16.

The above measuring sequence is repeated until the feedback voltage becomes below a predetermined value. Thereafter, the same measuring sequence is repeated, and measured voltages after the feedback voltage becomes below the predetermined value are added and averaged to provide a measured voltage.

According to the first embodiment, the measured voltages after the feedback voltage becomes smaller than the predetermined value are indicated as $V^w(m)$, and h pieces of measured voltages $V^1(m)$ to $V^h(m)$ are added and averaged to find a measured voltage as follows:

$$V_h(m) = \frac{\sum_{w=1}^{h} V^w(m)}{h} \quad (9)$$

A voltage resolution $Vresol(h)$ of this measured voltage is obtained as follows:

$$Vresol(h) = 3\left[\frac{\sum_{k=1}^{h-1} Var(k)}{2 \cdot h \cdot (h-1)}\right]^{\frac{1}{2}} \quad (10)$$

where, $Var(k)$ is a divergence of feedback voltages, which is obtained as follows:

$$Var(k) = \frac{\sum_m [VF^k(m) - \overline{VF(k)}]^2}{\sum_m 1} \quad (11)$$

where $VF^k(m)$ is a feedback voltage, which is obtained as follows:

$$VF^k(m) = V^{k+1}(m) - V^k(m) \quad (12)$$

An average $\overline{VF^k(m)}$ of the feedback voltages is obtained as follows:

$$\overline{VF(k)} = \frac{\sum_m VF^k(m)}{\sum_m 1} \quad (13)$$

In this way, the first embodiment superimposes a probe voltage $P^i(m)$ on a measured voltage $V^i(m)$, calculates a correct convergence factor $\alpha^*$ at this moment, and determines a feedback voltage according to the convergence factor $\alpha^*$. Thus, the first embodiment is capable of accurately measuring a voltage with no influence of the noise $N^i(m)$ and probe voltage $P^i(m)$.

The first embodiment stably obtains the voltage resolution $Vresol(h)$ of an averaged measured voltage $V^h(m)$ according to the equation (10), with no influence of environmental changes such as a variation of the electron beam current or an attachment of contaminated particles and a growth of the contamination.

The invention evaluates the reliability of the measured voltage according to the voltage resolution $Vresol(h)$. The $Vresol(h)$ takes a large value at first and then gradually decreases. When the resolution Vresol(h) becomes lower than a given value, it is determined that a measured voltage at the moment nearly corresponds to the slice level SL. Namely, when the resolution Vresol(h) becomes smaller than the given value, the voltage measuring operation with the electron beam apparatus is stopped. Namely, once a voltage equal to a true voltage on an IC, etc., to be measured is obtained, no excessive measurement is carried out. This prevents electron beams from excessively exposing and breaking the IC.

Figure 10:
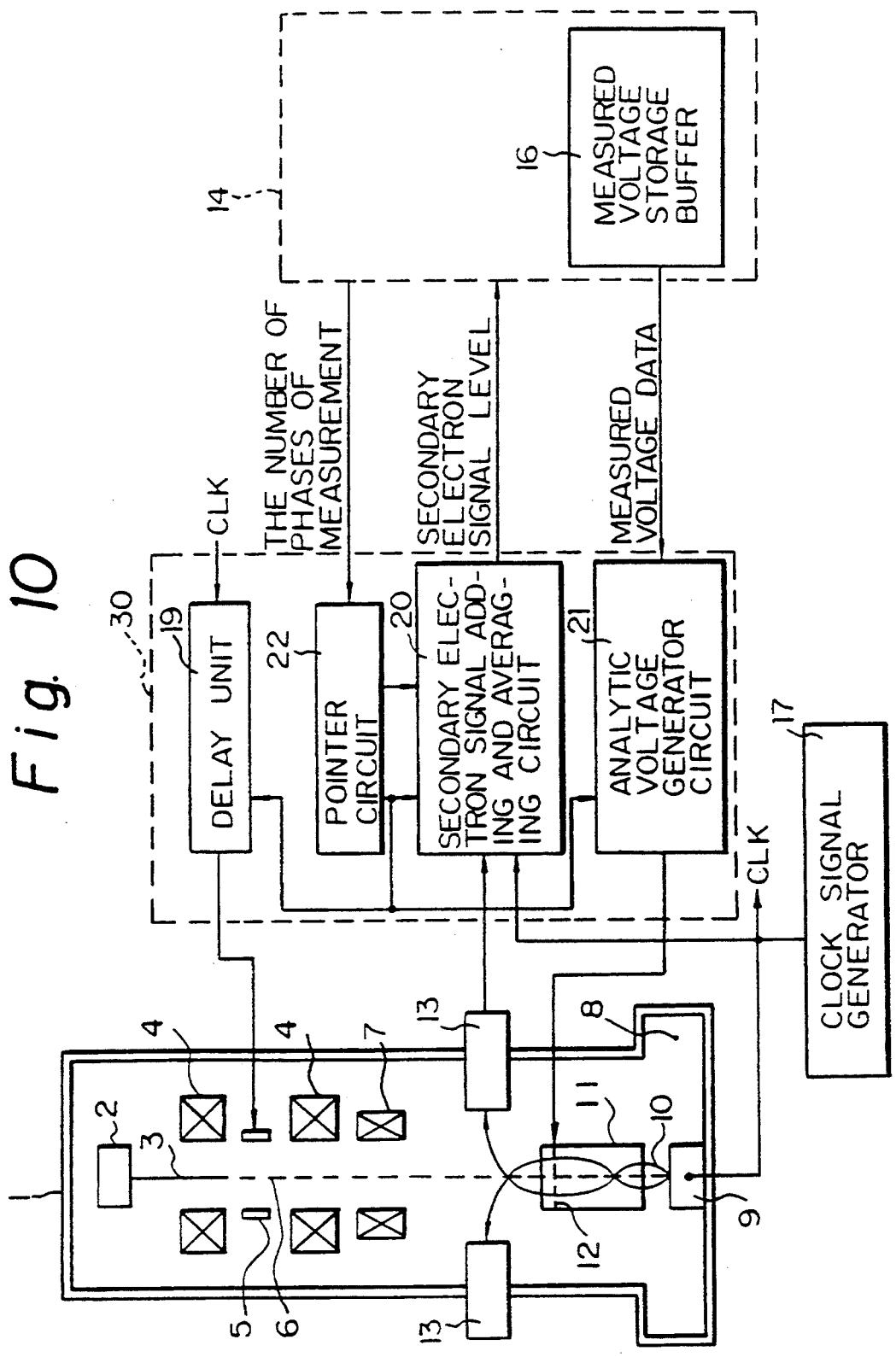
FIG. 10 is a view showing essential part of an electron beam apparatus according to a second embodiment based on the second invention.

FIG. 10 shows essential part of an electron beam apparatus according to the second embodiment of the invention.

In the figure, numeral 22 is a pointer circuit for providing data for specifying a phase of measurement at random. According to the first embodiment, the probe voltage $P^i(m)$ is known. The second embodiment uses, instead of the probe voltage, a difference ($67(j) = VR(j) - VR(j-1)$) between the last measured voltage and a measured voltage of this time.

An analytic voltage VR(j) at a "j"th phase is expressed as follows:

$$VR(j) = V(j) + N(j) \tag{14}$$

where V(j) is a "j"th true analytic voltage, and N(j) is noise. A secondary electron signal level Se(j) measured at each phase is expressed as follows:

$$\begin{aligned} Se(j) &= SL - \frac{1}{\alpha} N(j) + n(j) + \\ &\quad C[VR(j) - VR(j-1)] \\ &= SL - \frac{1}{\alpha} N(j) + n(j) + C \cdot \delta(j) \end{aligned} \tag{15}$$

where $\delta(j) = VR(j) - VR(j-1)$, n(j) is newly added noise, $\delta(j)$ is an error caused by a change in the analytic voltage, C is an unknown number, and $\alpha$ is an inverse number of $\beta$ of the equation (3).

Here, the analytic voltage change $\delta(j)$ caused by a phase change has no correlation with the noises N(j) and n(j). According to the second embodiment, a correlation between Se(j) and $\delta(j)$ is expressed as follows:

$$\sum_j Se(j) \cdot \delta(j) = SL \sum_j \delta(j) - \frac{1}{\alpha} \sum_j N(j) \cdot \delta(j) + \sum_j n(j) \cdot \delta(j) + C \sum_j [\delta(j)]^2 \approx C \sum_j [\delta(j)]^2 \tag{16}$$

$C\delta(j)$ is obtainable according to the correlation between Se(j) and $\delta(j)$ and an autocorrelation of $\delta(j)$, as follows:

$$C\delta(j) \approx \frac{\sum_j Se(j) \cdot \delta(j)}{\sum_j [\delta(j)]^2} \cdot \delta(j) \tag{17}$$

This equation 17 indicates a noise component contained in the secondary electron signal level Se(j) sampled at random. Removing the error $C\delta(j)$ from the secondary electron signal level Se(j) will provide a correct secondary electron signal level.

In this way, the second embodiment considers an error in a secondary electron signal level when a phase of measurement is scanned at random, thereby accurately measuring a voltage.

As mentioned above, this embodiment uses a difference between measured voltages. Since the amplitude of the difference is unknown, the second embodiment cannot directly find a convergence factor, unlike the first embodiment. The second embodiment, therefore, finds a correlation of the convergence factor to determine an influence on a true secondary electron signal level. The correlated part is subtracted from a measured voltage, to provide a correct secondary electron signal level.

More precisely, a first step of the embodiment subtracts the equation (17) from the equation (15), i.e., removes an error $C\delta(j)$ from a measured secondary electron signal level after obtaining a measured voltage $VR^i$ at "i"th sampling, to thereby cancel a noise component caused by random sampling and provide a correct secondary electron signal level Se(j). (This value, however, includes original noise.) A second step finds a difference $\Delta Se(j)$ between the correct secondary electron signal level Se(j) and the slice level SL on the S curve, as follows:

$$\Delta Se(j) = Se(j) - SL \tag{18}$$

At this time, $\alpha^*$ is calculated according to the following equation (19) based on a measured voltage $VR^{i+1}$ of the next sampling:

$$VR^{i+1} = VR^1 + \alpha^* \Delta Se(j) \tag{19}$$

A third step sets $\alpha^* \Delta Se(j)$ as a feedback voltage, compares it with the slice level SL, and removes a noise component in the measured voltages. A fourth step sets the obtained voltage as a new measured voltage.

It is possible to carry out random sampling in the first embodiment.

As mentioned above, the first invention considers a convergence factor's change caused by a change in an S curve, calculates a new convergence factor accordingly, and updates an analytic voltage, thereby precisely measuring a voltage.

The second invention considers an error in a secondary electron signal level when a phase of measurement is scanned at random, and precisely calculates a secondary electron signal level, thereby correctly measuring a voltage.

Referring to FIGS. 8 and 10, the method of measuring a voltage of wiring on an IC using an electron beam apparatus according to the invention will be explained in more detail.

The control computer 14 has functions of controlling measuring sequences, displaying measured results, serving as a user interface for controlling an EB tester, etc. The control computer 14 is connected to the signal processing circuit 30 through GPIB and SCSI buses, common memories, etc. The control computer 14 provides the signal processing circuit 30 with control signals for starting and terminating measurement. The signal processing circuit 30 provides the control computer 14 with measured voltage waveforms.

The signal processing circuit 30 receives a frequency signal from a pattern generator of the control computer 14, delays the signal according to measuring timing, and provides a blanking pulse. The blanking pulse is applied to the blanker 5, which produces an electron strobe beam. When the strobe beam hits the wiring of the LSI 9 to be tested, a voltage present at the spot hit by the strobe beam on the wiring of the LSI is measurable.

The signal processing circuit 30 applies an analytic voltage at measured timing to the energy analyzer 12, while letting the strobe beam irradiating the LSI 9 at the measured timing. The secondary electron detector 13 converts secondary electrons produced by the LSI 9 into an electric signal according to which the signal processing circuit 30 computes a measured voltage for the measured timing according to the above-mentioned software feedback method.

To obtain a measured voltage for given measured timing, measurement is repeatedly carried out, and measured results are added and averaged to improve S/N.

The signal processing circuit 30 may be connected to a CRT that displays the intermediate results and waveforms of measured voltages.

The signal processing circuit 30 has, for example, a GPIB interface (not shown) for connecting itself to the control computer 14.

Individual circuits of the apparatus are connected to one another through proper system buses and a processor circuit involving microprocessors, ROMs, and RAMs.

Figure 11:
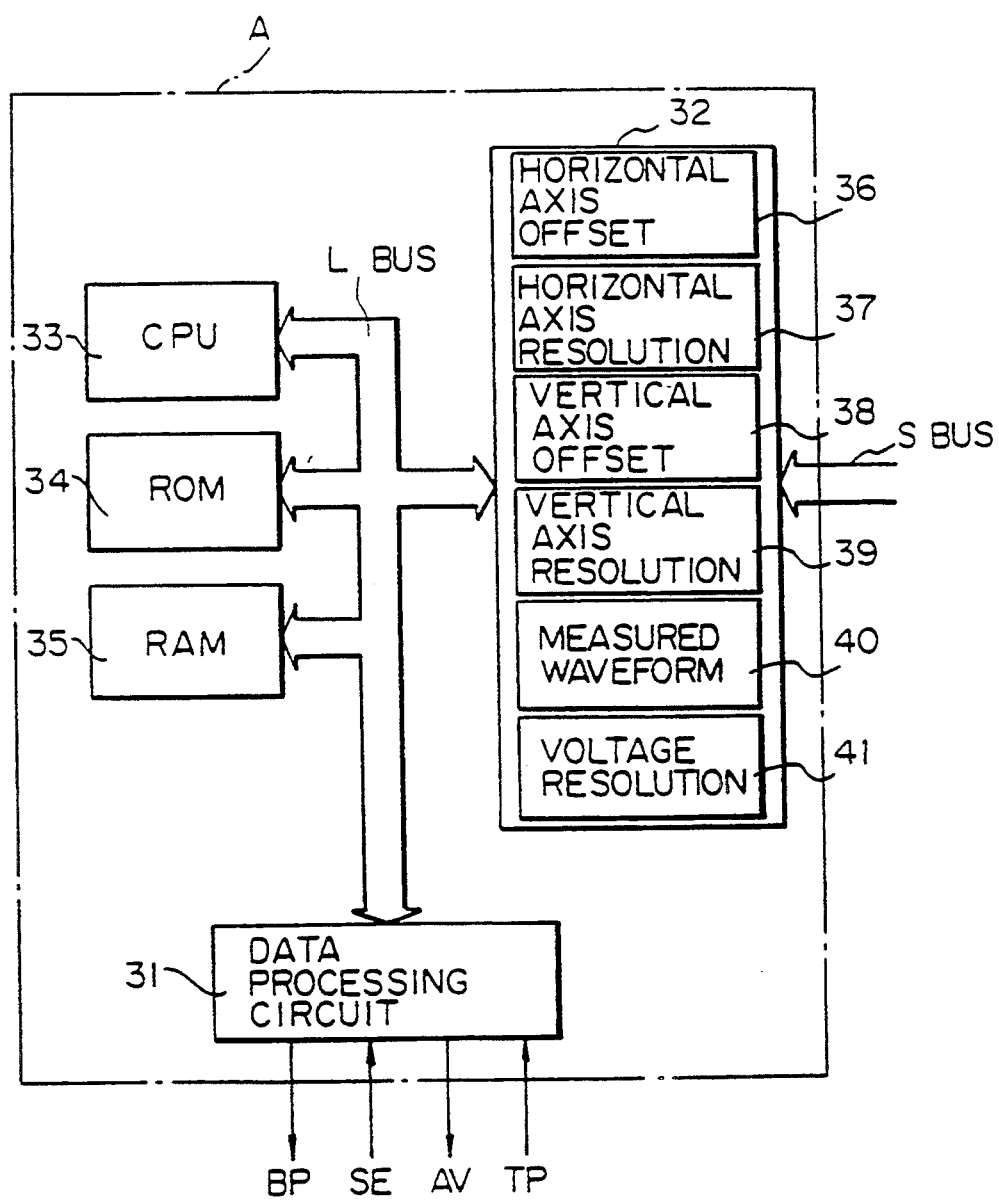
FIG. 11 is a view showing an acquisition portion A disposed inside a signal processing circuit 30 according to the invention.

The delay unit 19, counter circuit 18, secondary electron signal adding and averaging circuit 20, and analytic voltage generator 21 of the signal processing circuit 30 may form a data processing circuit 31 of an acquisition portion A shown in FIG. 11.

The acquisition portion A is connected to a system bus SBUS through a common RAM 32. The acquisition portion A incorporates a microprocessor 33, a ROM 34, a RAM 35, and the data processing circuit 31. They are connected to one another through a local bus LBUS.

The common RAM 32 involves a region for storing vertical (voltage axis) information such as a vertical axis offset 38 and a vertical axis resolution 39, a region for storing horizontal (time axis) information such as a horizontal axis offset 36 and a horizontal axis resolution 37, a region for storing a measured waveform 40 obtained in the acquisition portion A, and a region for storing a voltage resolution 41 of the voltage waveform. The vertical and horizontal information and measured waveform are loaded from a processor portion (not shown) through the system bus SBUS.

The ROM 34 stores control programs for the microprocessor 33. The RAM 35 provides a work area, which is used for adding and averaging voltage waveforms.

The data processing circuit 31 measures voltages with hardware.

Figure 12B:
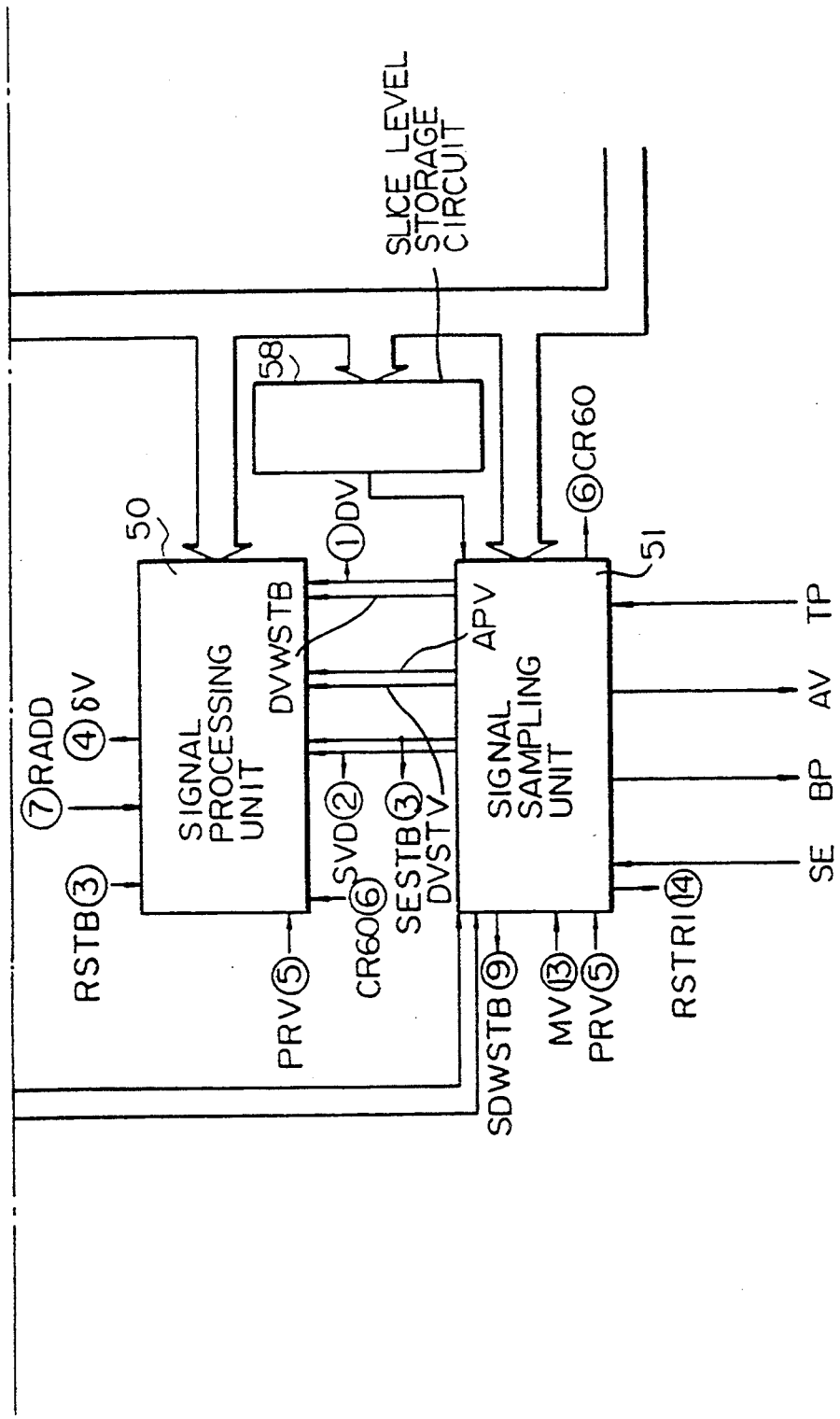
FIG. 12 including FIG. 12a and FIG 12b is a view showing a circuit for carrying out the voltage measuring method of the invention.

FIG. 12 shows an example of an internal arrangement of the data processing circuit 31. The signal processing circuit 30 in FIGS. 8 and 10 corresponds to a signal processing unit 50 and a signal sampling unit 51 of FIG. 12.

In FIG. 12, the data processing circuit 31 comprises, for example, the signal sampling unit 51, the signal processing unit 50, a feedback unit 54, a feedback process control unit 53, a slice level storage circuit 58, a probe voltage storage circuit 56, a signal level deviation storage circuit 57, a measured voltage storage circuit 55, and a voltage resolution computation unit 52. These elements are connected to the microprocessor 33 through the local bus LBUS, so that data can be read and written to and from the microprocessor 33, and control parameters set in the elements.

Figure 13:
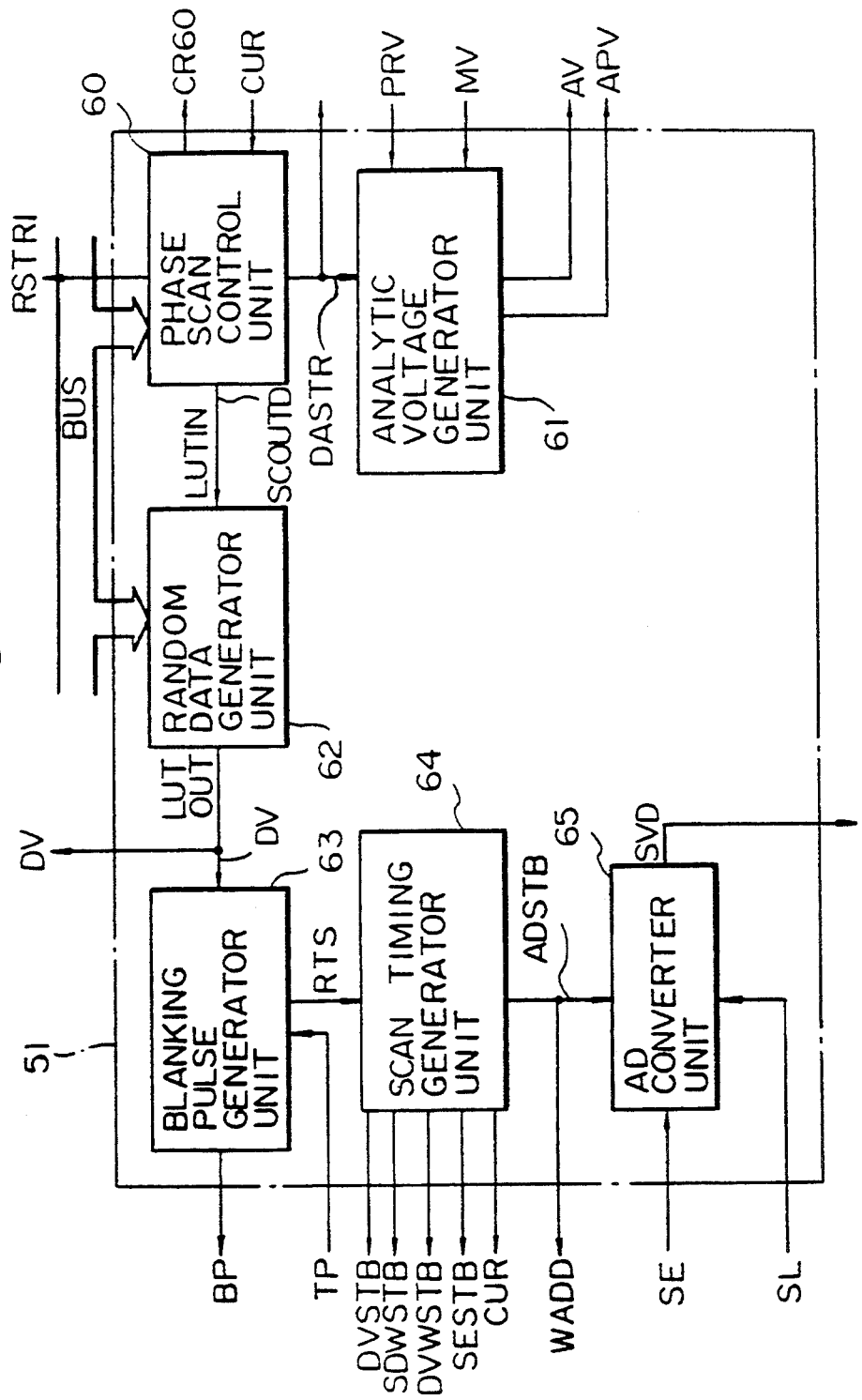
FIG. 13 is a view showing an example of a signal sampling unit shown in FIG. 12.

FIG. 13 is a block diagram showing the signal sampling unit 51. The signal sampling unit 51 comprises an A/D converter unit 65, a phase scan control unit 60, a random data generator unit 62, an analytic voltage generator unit 61, a blanking pulse generator unit 63, and a scan timing generator unit 64. The phase scan control unit 60 and random data generator unit 62 are connected to the microprocessor 33 through the local bus LBUS.

An operation of the signal sampling unit 51 will be explained in detail with reference to FIGS. 12 and 13.

The phase scan control unit 60 comprises a scan counter circuit and two fixed delay circuits. The scan counter circuit is connected to the microprocessor through the local bus.

The scan counter circuit comprises a counter that is incremented in response to a count-up request CUR, and a maximum count specifying register that defines a count-up limit. A value set in the maximum count specifying register is set by the microprocessor. When the microprocessor sets a value in the maximum counter specifying register, the scan counter circuit is put in an idle state.

The count-up request CUR to the phase scan control unit 60 is related to a repeat pattern (a trigger signal) from a pattern generator. When receiving the count-up request CUR in an initial state, the phase scan control unit 60 generates a clear signal CR60. When receiving a strobe in the count-up request CUR, the phase scan control unit 60 provides the present counter value as scan counter data SCOUTD, increments the count, and generates a strobe in a count-up signal.

The count-up signal receives one fixed delay and becomes a read strobe 1 (RSTR1). The read strobe 1 (RSTR1) is sent to the probe voltage storage circuit 56, and becomes a sampling data read strobe.

The count-up signal receives two fixed delays and becomes a DA conversion strobe (DASTR). The DA conversion strobe DASTR is sent to the analytic voltage generator unit 61, and specifies timing at which an analytic voltage AV is generated through D/A conversion.

When a count after the increment is equal to the count-up limit, the phase scan control unit 60 is initialized. The count-up limit is equal to the number of phases of measuring spots.

The random data generator unit 62 comprises a random data generator and a look-up table (LUT) for address conversion. The random data generator unit 62 changes the order of values ranging from 0 to N specified by the microprocessor at random, and writes them at addresses from 0 to N of the LUT. The N is equal to the number of phases of measuring spots minus one.

Data from the phase scan control unit 60 is provided to the address conversion LUT. An output of the address conversion LUT holds LUT data read out of the LUT with the input data to the LUT being an address. The LUT output serves as a delay specifying value DV.

The read strobe 1 (RSTR1) of the phase scan control unit 60 indicates timing at which the LUT output is settled. The DA conversion strobe DASTR of the phase scan control unit 60 specifies timing at which the analytic voltage generator unit 61 determines an analytic voltage AV supplied to the analyzer grid according to a probe voltage PRV and a measured voltage MV corresponding to the specified delay.

The analytic voltage generator unit 61 adds the probe voltage PRV from the probe voltage storage circuit 56 to the measured voltage MV from the measured voltage storage circuit 55 in an adder, and provides an applying voltage APV. The applying voltage APV is provided to a DA converter, converted into an analog analytic voltage in response to a DA conversion strobe, and supplied to the analyzer grid 12.

The blanking pulse generator unit 63 comprises a delay specifying circuit including a common memory for storing delay data, a delay circuit, and a pulse generator. The common memory of the delay specifying circuit receives delay data from the microprocessor through the local bus LBUS. By reading data out of the common memory with a delay specifying value DV from the random data generator unit 62 as an address, delay data is obtained. The delay data is transferred to the delay circuit. The delay circuit receives a trigger signal (a repetitive pattern) TP from the pattern generator, applies a delay specified by the delay data to the trigger signal, and provides a reference timing signal RTS.

The reference timing signal RTS serves as the trigger signal TP for the pulse generator, so that a blanking pulse BP is produced synchronously with the reference timing signal RTS and supplied to the blanker 5. Thereafter, the reference timing signal RTS serves as a reference of processing a secondary electron signal produced by a strobe electron beam generated according to the blanking pulse BP.

The scan timing generator unit 64 comprises four fixed delay stages connected in series.

When the reference timing signal RTS is passed through the first delay stage, there are provided an AD conversion strobe and a differential voltage computation processing strobe DVSTB.

When the reference timing signal RTS is passed through the second delay stage, there are provided a signal level deviation write strobe SDWSTB and a differential voltage write strobe DVWSTB.

When the reference timing signal RTS is passed through the third delay stage, there is provided a secondary electron signal processing strobe SESTB.

When the reference timing signal RTS is passed through the fourth delay stage, there is provided a count-up request strobe CUR. The count-up request strobe CUR indicates an end of a series of secondary electron signal processing sequences at specific timing. The count-up request strobe CUR is transferred to the phase scan control unit 60, to start the secondary electron sampling and signal processing sequences at a new timing.

The AD converter unit 65 comprises an AD converter (ADC), and an accumulator for calculating a signal level deviation according to a difference between an AD converted secondary electron signal (a value after AD conversion of a secondary electron signal) and the slice level SL read out of the slice level storage circuit 58.

A secondary electron signal SE transferred from the secondary electron detector to the AD converter unit 65 is converted into a digital signal in response to an AD converting strobe ADSTB.

The accumulator in the AD converter unit 65 calculates a difference (a signal level deviation) SVD between the level of the AD converted secondary electron signal and the slice level. The difference SVD is an output of the AD converter unit 65.

The signal level deviation SVD is used to correct an analytic signal for updating a voltage measurement value and convergent factor and scanning a phase at random.

Figure 14:
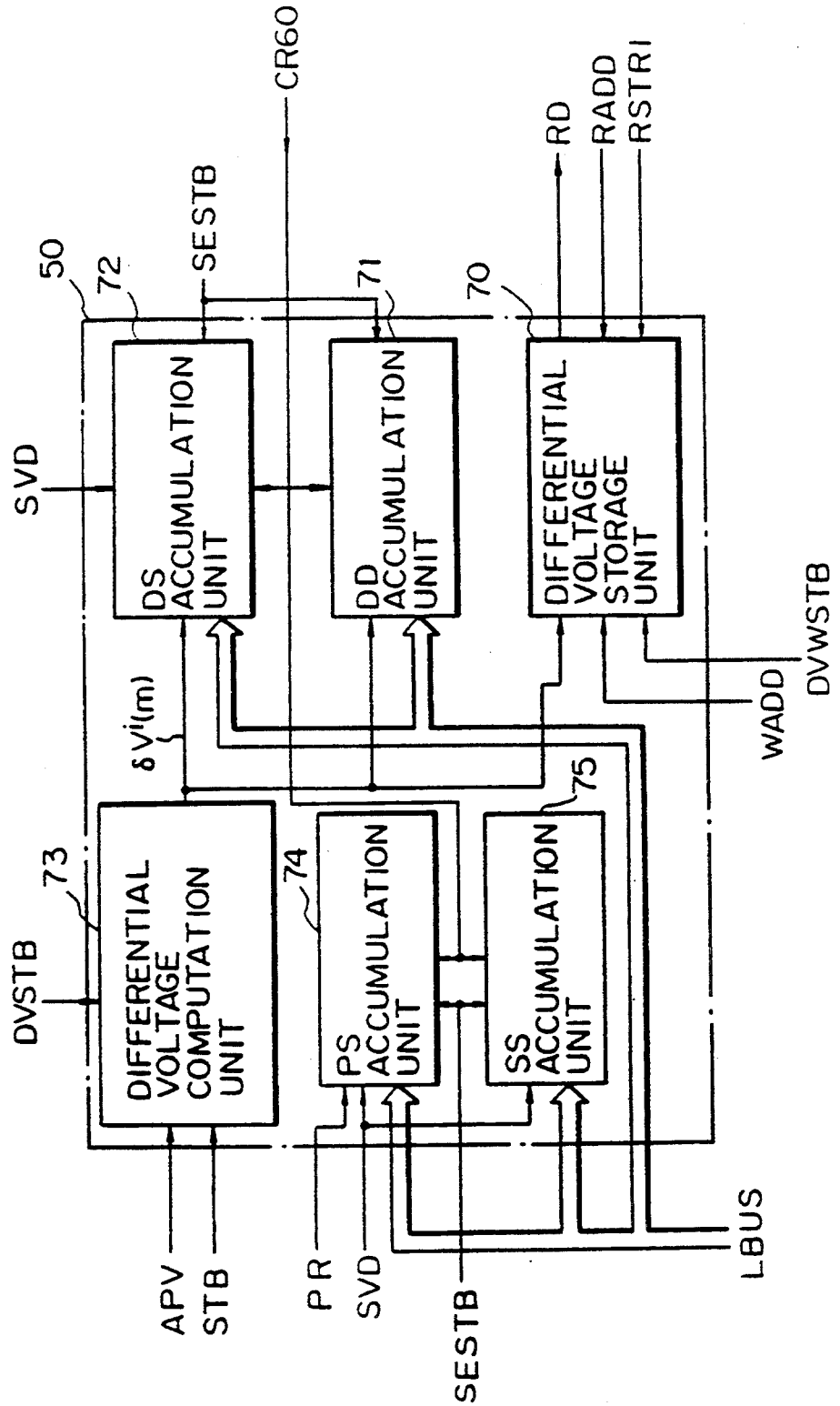
FIG. 14 is a view showing an example of a signal processing unit shown in FIG. 12.

FIG. 14 is a block diagram showing the signal processing unit 50. The signal processing unit 50 comprises a differential voltage computation unit 73, a PS accumulation unit 74, an SS accumulation unit 75, a DS accumulation unit 72, a DD accumulation unit 71, and a differential voltage storage unit 70.

The PS accumulation unit 74 provides a correlation between a probe voltage P and the secondary electron signal SE.

The SS accumulation unit 75 provides an autocorrelation (power) of the secondary electron signal SE.

The DS accumulation unit 72 provides a correlation between a differential voltage $\delta V^i(m)$ (a swing of an analytic voltage due to phase scan) and the secondary electron signal level SE.

The DD accumulation unit 71 calculates an autocorrelation (power) of the differential voltage $\delta V^i(m)$.

The PS accumulation unit 74, SS accumulation unit 75, DS accumulation unit 72, and DD accumulation unit 71 are connected to the microprocessor through the local bus LBUS. The microprocessor finds the correction quantity of a convergence factor according to the correlation between the probe voltage P and the secondary electron signal SE and the power of the secondary electron signal SE, and obtains a correction quantity for an error in the secondary electron signal due to random phase scanning, according to the correlation between the differential voltage D and the secondary electron signal SE and the power of the differential voltage D.

An operation of the signal processing unit 50 will be explained in detail.

The PS accumulation unit 74 comprises a multiplier for multiplying the probe voltage P by the signal level deviation SVD, an accumulator for calculating a sum of multiplied values, and a PS accumulation register for storing the sum.

The PS accumulation register is cleared in response to the clear signal CR60 provided by the phase scan control unit 60 of the signal sampling unit 51.

A product of the probe voltage P and signal level deviation SVD is calculated in response to the secondary electron signal processing strobe SESTB from the scan timing generator unit 64 of the signal sampling unit 51, and the result is accumulated in the PS accumulation register through the accumulator.

The SS accumulation unit 75 comprises a look-up table LUT for calculating a product (square) of the signal level deviation SVD, an accumulator for calculating a sum of squares, and an SS accumulation register for storing the sum of squares.

The SS accumulation register is cleared in response to the clear signal CR60 provided by the phase scan control unit 60 of the signal sampling unit 51.

The signal level deviation SVD is converted into a square with the look-up table LUT in response to the secondary electron signal processing strobe SESTB from the scan timing generator unit 64 of the signal sampling unit 51, and the square is accumulated by the accumulator and stored in the SS accumulation register.

The differential voltage computation unit 73 comprises an applied voltage holding register, an accumulator, and a differential voltage storage register.

The differential voltage computation unit 73 computes a difference $\delta V^i(m)$ between the applied voltage APV provided by the analytic voltage generator unit 61 of the signal sampling unit 51 and a value stored in the applied voltage holding register in response to the differential voltage computation processing strobe DVSTB from the scan timing generator unit 64 of the signal sampling unit 51, and stores the difference in the differential voltage storage register.

The contents of the applied voltage holding register are updated by giving the differential voltage computation processing strobe DVSTB a fixed delay, after the differential voltage $\delta V^i(m)$ is determined.

The DS accumulation unit 72 comprises a multiplier for multiplying the differential voltage $\delta V^i(m)$ by the signal level deviation SVD, an accumulator for calculating a sum of multiplied values, and a DS accumulation register for storing the sum of multiplied values.

The DS accumulation register is cleared in response to the clear signal CR60 provided by the phase scan control unit 60 of the signal sampling unit 51.

A product of the differential voltage $\delta V^i(m)$ and signal level deviation SVD is calculated in response to the secondary electron signal processing strobe SESTB from the scan timing generator unit 64 of the signal sampling unit 51, and the calculated product is accumulated in the DS accumulation register through the accumulator.

The DD accumulation unit 71 comprises a look-up table LUT for providing a product (square) of the differential voltage $\delta V^i(m)$, an accumulator for calculating a sum of squares, and a DD accumulation register for storing the sum of squares.

The DD accumulation register is cleared by the clear signal CR60 provided by the phase scan control unit 60 of the signal sampling unit 51.

The differential voltage $\delta V^i(m)$ is converted into a square through the look-up table LUT in response to the secondary electron signal processing strobe SESTB from the scan timing generator unit 64 of the signal sampling unit 51, and accumulated in the DD accumulation register through the accumulator.

The differential voltage storage unit 70 comprises a differential voltage memory and a memory control circuit.

In response to the write strobe DVWSTB, the differential voltage storage unit 70 writes the differential voltage $\delta V^i(m)$ into the differential voltage memory at an address specified by a write address WADD, which is provided by the scan timing generator unit 64 of the signal sampling unit 51.

The differential voltage stored in the differential voltage memory is used to find a signal correction quantity according to the signal level deviation SVD and differential voltage $\delta V^i(m)$ in the feedback unit.

In response to the read strobe RSTR1, the differential voltage storage unit 70 reads data from the differential voltage memory at an address specified by a read address RADD, and provides read data RD.

The read address RADD is given as data of the scan counter of the feedback process control unit 53.

The read strobe RSTR1 is prepared by applying a fixed delay to the count-up signal to the scan counter of the feedback process control unit 53.

Figure 15:
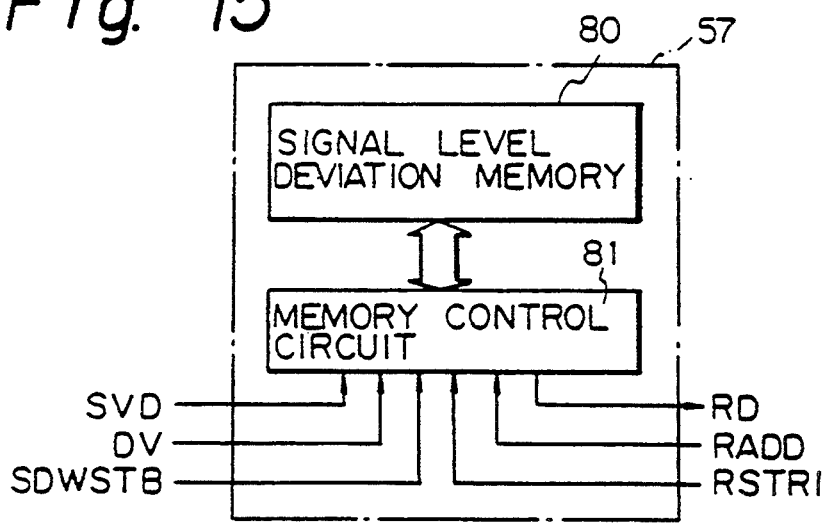
FIG. 15 is a view showing an example of a signal level deviation storage shown in FIG. 12.

FIG. 15 is a block diagram showing the signal level deviation storage circuit 57.

The signal level deviation storage circuit 57 comprises a signal level deviation memory 80 and a memory control circuit 81.

In response to the write strobe SDWSTB, the signal level deviation storage circuit 57 writes the signal level deviation SVD into the signal level deviation memory 80 at an address specified by a write address DV, which is an output of the random data generating circuit 62 of the signal sampling unit 51. The write strobe SDWSTB is an output of the scan timing generator unit 64 of the signal sampling unit 51.

The signal level deviation SVD stored in the signal deviation memory 80 is used to find a signal correction quantity according to the signal level deviation SVD and differential voltage $\delta V^i(m)$ in the feedback unit 54.

In response to the read strobe RSTR1, the signal level deviation storage circuit 57 reads data from the signal level deviation memory 80 at an address specified by a read address RADD, and provides read data RD. The read address RADD is given as data of the scan counter of the feedback process control unit 53.

The read strobe RSTR1 is obtained by applying a fixed delay to the count-up signal to the scan counter of the feedback process control unit 53.

Figure 16:
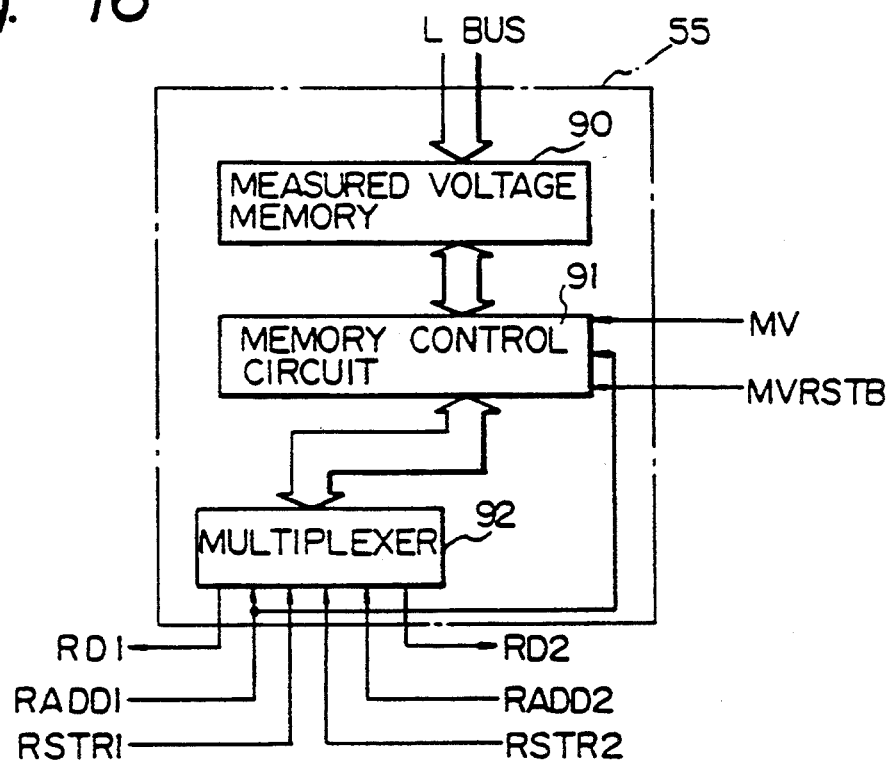
FIG. 16 is a view showing an example of a measured voltage storage shown in FIG. 12.

FIG. 16 is a block diagram showing the measured voltage storage circuit 55.

The measured voltage storage circuit 55 comprises a measured voltage memory 90, a memory control circuit 91, and a multiplexer 92.

The measured voltage memory 90 is a dual port memory to be accessed by the microprocessor through the local bus LBUS.

A measured voltage stored in the circuit 55 is used to set a voltage, which is to be applied to the analyzer grid in sampling a signal, according to a sum of the measured voltage and probe voltage, and to update the measured voltage according to the signal correction quantity in the feedback unit.

To read the measured voltage in signal sampling, read data RD2, read address RADD2, and read strobe RSTR2 are used. The read address RADD2 is the delay quantity specifying value DV from the random data generator circuit 62 of the signal sampling unit 51. The read strobe RSTR2 is the read strobe RSTR1 from the phase scan control unit 60 of the signal sampling portion 61. The read data RD2 is the measured voltage MV provided to the analytic voltage generator unit 61 of the signal sampling unit 51.

When the feedback unit 54 refers to the measured voltage MV, the measured voltage is read and written according to the read data RD1, read address RADD1, read strobe RSTR1, measured voltage MV, and write strobe MVRSTB. Since the read measured voltage is fed back and again stored in the voltage measured memory 90 as new measured voltage data, a read address RADD is equal to a write address WADD.

The read address RADD1 is given as data to the scan counter of the feedback process control unit 53.

The read strobe RSTR1 is obtained by applying a fixed delay to the count-up signal of the scan counter of the feedback process control unit 53.

The measured voltage MV is given as a measured voltage (updated value) from the feedback unit 54. The measured voltage write strobe MVRSTB is obtained as an output from the feedback unit 54 by applying four steps of fixed delays to a feedback strobe FBSTB from the feedback process control unit 53.

Figure 17:
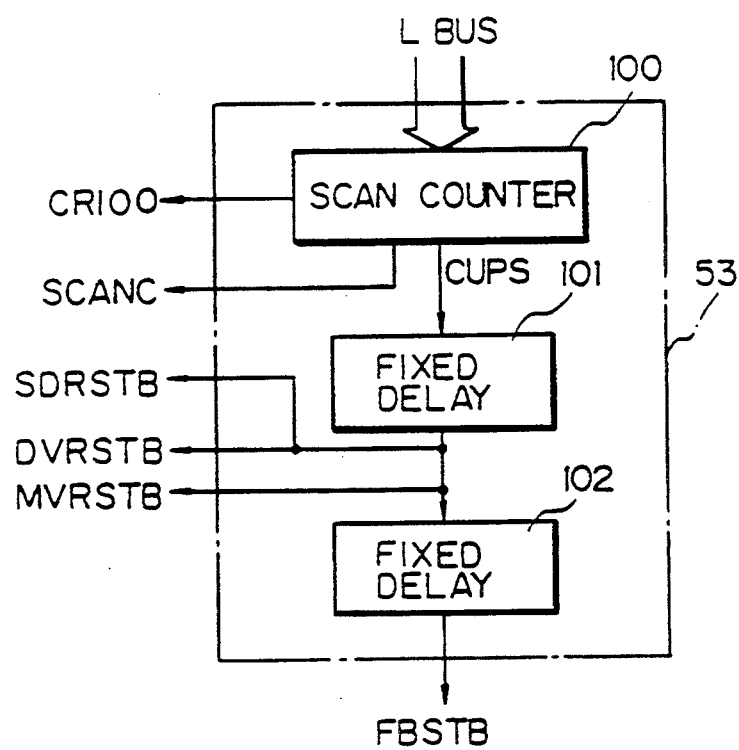
FIG. 17 is a view showing an example of a feedback processing control unit shown in FIG. 12.

FIG. 17 is a block diagram showing the feedback process control unit 53.

The feedback process control unit 53 comprises a scan counter 100 and two fixed delay circuits 101 and 102. The scan counter 100 is connected to the microprocessor through the local bus LBUS.

The scan counter 100 comprises a counter that is incremented in response to a count-up request, and a maximum count specifying register for specifying an upper limit of counting up. A value in the maximum count specifying register is set by the microprocessor.

When the microprocessor writes a value into the maximum counter specifying register, the scan counter 100 is zeroed to provide a clear signal CR100. The scan counter 100 is then put in an initial state.

From the initial state, the scan counter 100 is incremented at a given rate, and provides a count-up signal CUPS.

The count-up signal CUPS is delayed by the fixed delay 101, to thereby provide a signal level deviation read strobe SDRSTB, differential voltage read strobe DVRSTB, and measured voltage read strobe MVRSTB.

The count-up signal CUPS is delayed by the fixed delays 101 and 102, to thereby provide the feedback process strobe FBSTB.

These strobes define an operation timing of the feedback unit 54 and voltage resolution computation unit 52.

The feedback process control unit 53 is put in an idle state if a count after increment is equal to the upper limit of counting up. The upper limit of counting up is equal to the number of phase points of measurement.

Figure 18:
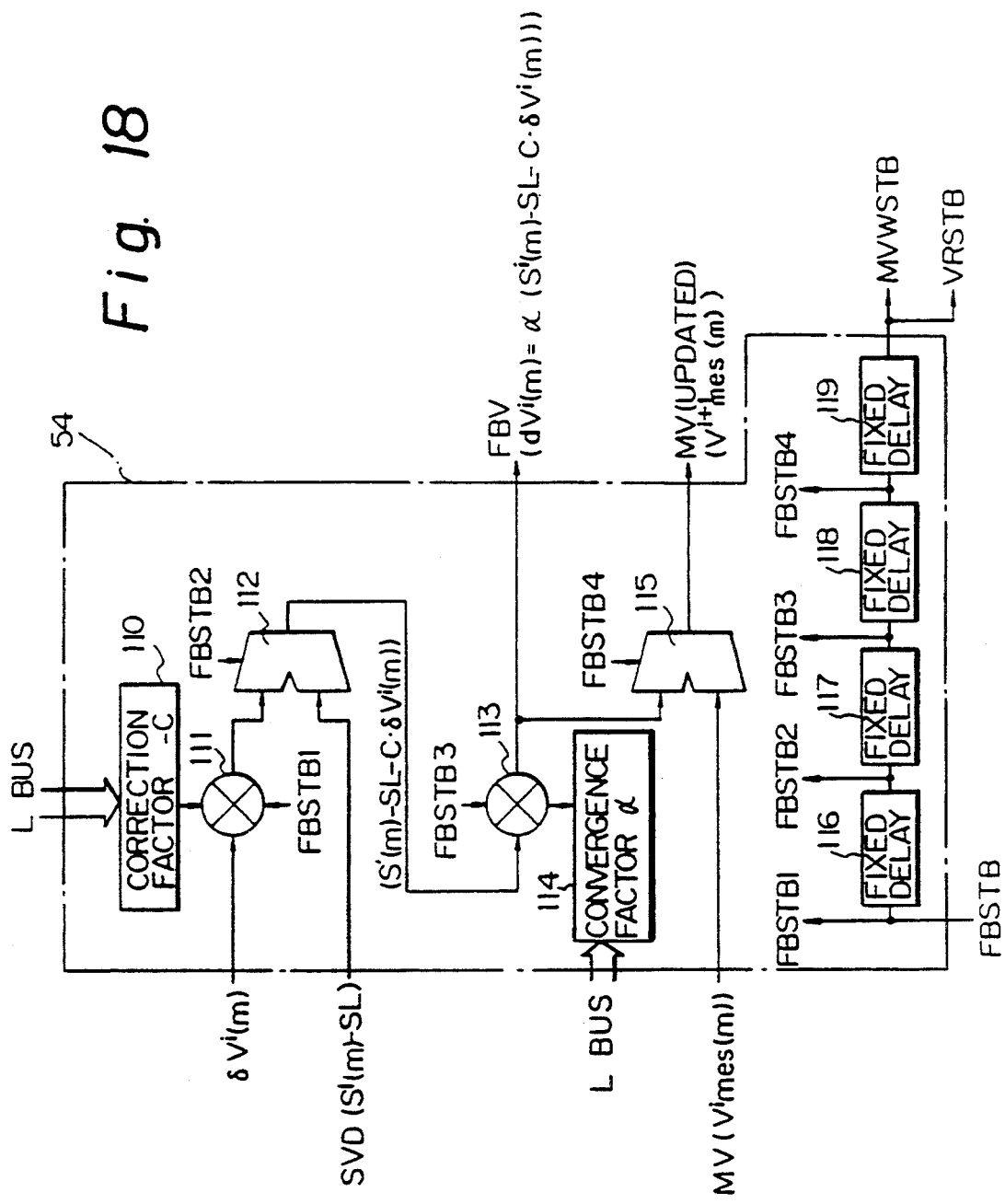
FIG. 18 is a view showing an example of a feedback unit shown in FIG. 12.

FIG. 18 is a block diagram showing the feedback unit 54.

The feedback unit 54 carries out a process of finding a signal correction quantity according to the differential voltage $\delta V^i(m)$ and signal level deviation SVD, and a process of updating a measured voltage by feeding back the measured voltage by using the signal correction quantity.

A correction factor C is used for correcting an error that has been superimposed on the signal level deviation $SVD = S^i(m) - SL$ due to random phase scanning.

The correction factor C is computed by the microprocessor according to the values in the DS accumulation register 72 and DD accumulation register 71.

The convergence factor $\alpha$ is computed by the microprocessor according to the values in the PS accumulation register 74 and SS accumulation register 75.

Internal processes of the feedback unit 54 are carried out in synchronism with the feedback strobe FBSTB provided by the feedback process control unit 53.

The differential voltage $\delta V^i(m)$, signal level deviation SVD, and measured voltage MV (Vmes$^i$(m)) that are necessary for the feedback processes are read out of the differential voltage storage unit 70, signal level deviation storage circuit 57, and measured voltage storage circuit 55 of the signal processing unit 50 in synchronism with the strobe FBSTB from the feedback process control unit 53. These data are established before the feedback process strobe FBSTB.

The internal processes are carried out in synchronism with FBSTB1 to FBSTB4 produced by applying delays to the feedback process strobe FBSTB through delay circuits 116 to 119, to provide a feedback voltage FBV and an updated measured voltage MV(UPDATED) (Vmes$^{i+1}$(m)). The feedback voltage FBV is equal to $dV^i(m) = \alpha(S^i(m) - SL - C\delta V^i(m))$, and when a probe voltage is used, it must be added.

When both the feedback voltage and measured voltage (updated value) are determined, a measured voltage write strobe MVWSTB and a voltage resolution write strobe VRSTB are produced.

The updated measured voltage MV(UPDATED) is stored in the measured voltage storage circuit 55 in synchronism with the measured voltage write strobe MVWSTB at an address given according to the scan count data of the feedback process control unit 53.

The feedback voltage FBV is informed to the voltage resolution computation unit 52 and used for calculating a sum of squares (a sum of squares of $\delta V$) of feedback voltages required for calculating a voltage resolution.

FIG. 18 will be explained in more detail.

A multiplier 111 multiplies data from the register 110 that is storing a known correction factor $-C$ by the differential voltage $\delta V^i(m)$, to find a noise component $-C\delta V^i(m)$, where $\delta V^i(m)$ is equal to $\delta(j)$.

An adder 112 adds the signal level deviation $SVD = S^i(m) - SL$ to the $-C\delta V^i(m)$, to find a signal correction quantity $S^i(m) - SL - C\delta V^i(m)$. A multiplier 113 multiplies the signal correction quantity $S^i(m) - SL - C\delta V^i(m)$ by the convergent factor $\alpha$ read out of a convergent factor register 114 that is storing the known convergent factor $\alpha$, to provide the feedback voltage FBV, i.e., $dV^i(m) = \alpha(S^i(m) - SL - C\delta V^i(m))$.

An adder 115 adds the feedback voltage FBV to the measured voltage MV, to provide the updated measured voltage MV(UPDATED), i.e., Vmes$^{i+1}$(m).

Figure 19:
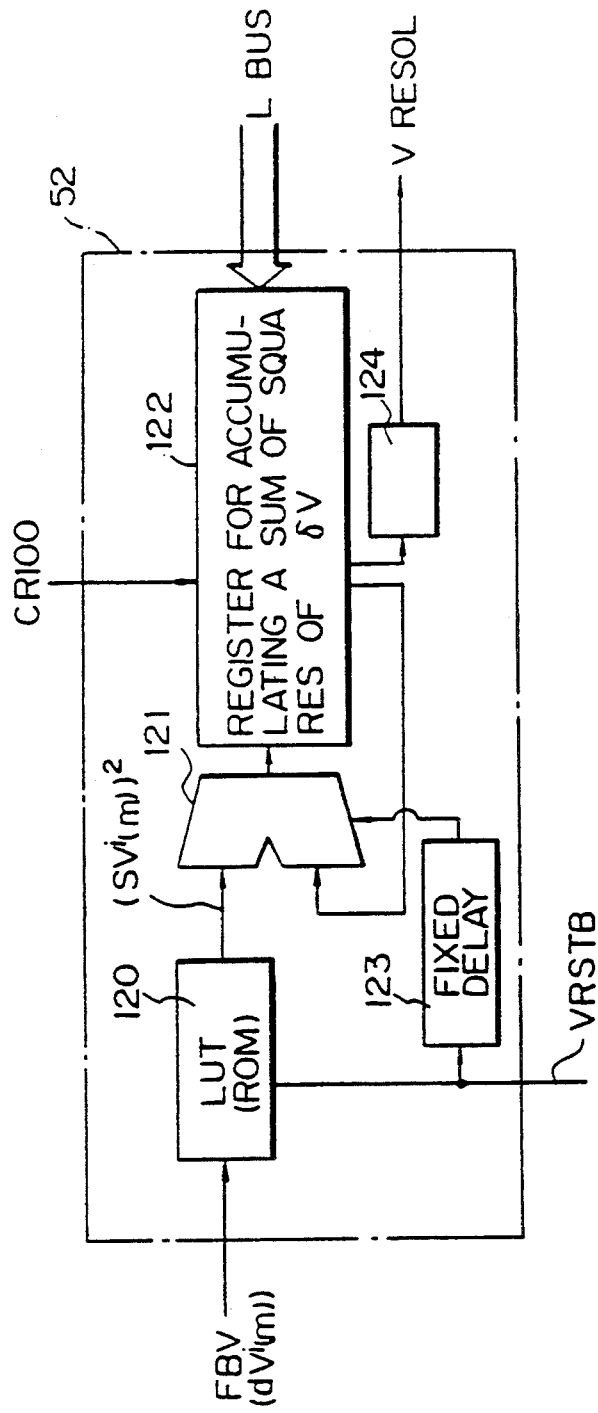
FIG. 19 is a view showing an example of a voltage resolution computation unit shown in FIG. 12.

FIG. 19 is a block diagram showing the voltage resolution computation unit 52.

The voltage resolution computation unit 52 computes a sum of squares of feedback voltage (a sum of squares of $\delta V$) in synchronism with the voltage resolution calculation strobe VRSTB from the feedback unit 54. In this case, it is preferable to remove the probe voltage from the feedback voltage FBV, provide the removed result to a look-up table (LUT) 120, and prepare a sum of squares of feedback voltage $\delta V^i(m)$.

An adder 121 adds the output of the look-up table, data read out of a register 122 for accumulating a sum of squares of $\delta V$, and predetermined data from a delay circuit 123 to one another. A result of the addition is stored in the register 122. By repeating these processes, a sum of squares of feedback voltages are determined. Thereafter, a voltage resolution computation circuit 124 computes a voltage resolution Vresol according to the equation (10).

A clear signal CR100 for initializing the register 122 is provided from the feedback process control unit 53.

The acquisition portion A operates in two stages, i.e., a signal sampling stage and a feedback stage.

The signal sampling stage is started when the microprocessor puts a probe voltage in the probe voltage storage circuit 56 and a slice level in the slice level storage circuit 58, and sets the scan counter of the phase scan control unit 60 of the signal sampling unit 51.

After signals are sampled, effective data are set in the PS accumulation unit 74, SS accumulation unit 75, DS accumulation unit 72, DD accumulation unit 71, and differential voltage storage unit 70, and a signal level deviation is also set.

The microprocessor computes the correction factor C and convergence factor $\alpha$ used by the feedback unit 54 according to the values in the PS, SS, DS, and DD accumulation units, and sets them in the registers in the feedback unit 54.

In the feedback stage, the correction factor C, convergence factor $\alpha$, differential voltage, and signal level deviation are used to feedback the measured voltage and obtain a new measured voltage (an updated value).

The microprocessor adds and averages updated measured voltages, and provides a resultant measured voltage (a measured waveform). The measured waveform is stored in the region for the measured waveform in the common memory of the acquisition portion A. Also, the microprocessor computes a voltage resolution according to a sum of squares of δV provided by the voltage resolution computation unit 52, and stores it in the region for the voltage resolution in the common memory of the acquisition portion A.

The arrangement of the probe voltage storage circuit 56 is substantially the same as that of the signal level deviation storage circuit 57 of FIG. 15, and therefore, an explanation of the same is omitted.

We claim:

1. A method of measuring a voltage with an electron beam apparatus that includes an electron beam pulse generating means for generating a pulse electron beam for irradiating a voltage measuring spot on a sample, an energy analyzer having an analyzer grid to which an analytic voltage is applied to form a decelerating electric field for controlling a passage of secondary electrons produced at the voltage measuring spot on the sample, and a secondary electron detector for detecting secondary electrons passed through the energy analyzer, the method comprising the steps of:

measuring a secondary electron signal level by applying an analytic voltage to the analyzer grid with a phase of measurement being scanned at random, measuring a change in the analytic voltage at each phase of measurement, computing an error in the measured secondary electron signal level according to a correlation between the change in the analytic voltage and the secondary electron signal level and according to an autocorrelation of the change in the analytic voltage, obtaining a correct secondary electron signal level according to the error, and obtaining an updated measured voltage according to the correct secondary electron signal level, a slice level set on an analytic-voltage-to-secondary-electron-signal-level-characteristic curve, the analytic voltage, and a convergence factor around the slice level.

* * * * *

UNITED STATES PATENT AND TRADEMARK OFFICE
CERTIFICATE OF CORRECTION

PATENT NO. : 5,416,426
DATED : May 16, 1995
INVENTOR(S) : Kazuo OKUBO et al.

It is certified that error appears in the above-indentified patent and that said Letters Patent is hereby corrected as shown below:

Column 7, line 18, change "67" to --$\delta$--.

Signed and Sealed this

Twenty-fifth Day of July, 1995

*Attest:*

BRUCE LEHMAN

*Attesting Officer*     *Commissioner of Patents and Trademarks*